United States Patent [19]
Leenaars

[11] Patent Number: 4,781,764
[45] Date of Patent: Nov. 1, 1988

[54] METHOD OF REMOVING UNDESIRED PARTICLES FROM A SURFACE OF A SUBSTRATE

[75] Inventor: Adriaan F. M. Leenaars, Eindhoven, Netherlands

[73] Assignee: U.S. Philips Corporation, New York, N.Y.

[21] Appl. No.: 76,101

[22] Filed: Jul. 21, 1987

[30] Foreign Application Priority Data

Jul. 28, 1986 [NL] Netherlands .......................... 8601939

[51] Int. Cl.⁴ ................................................ B08B 3/04
[52] U.S. Cl. ....................................... 134/34; 134/35; 134/42
[58] Field of Search .............................. 134/42, 34, 35

[56] References Cited

U.S. PATENT DOCUMENTS

| | | | |
|---|---|---|---|
| 3,664,871 | 5/1972 | Fauker | 134/42 |
| 4,169,807 | 10/1979 | Fuber | 134/31 |
| 4,178,188 | 12/1979 | Dussault et al. | 134/34 |
| 4,238,244 | 12/1980 | Banks | 134/34 |
| 4,375,992 | 3/1983 | Stevens et al. | 134/34 |

FOREIGN PATENT DOCUMENTS

| | | | |
|---|---|---|---|
| 8700094 | 1/1987 | European Pat. Off. | 134/34 |
| 2303612 | 3/1970 | France | 134/34 |
| 380754 | 4/1969 | U.S.S.R. | 134/34 |

OTHER PUBLICATIONS

IBM Technical Disclosure Bull. 17 (2), Jul. 1974 p. 408.

*Primary Examiner*—Asok Pal
*Attorney, Agent, or Firm*—John C. Fox

[57] ABSTRACT

A method of removing articles having a diameter which is smaller than 0.3 μm from a surface of a substrate, the method comprising moving an interface of the liquid over the surface of the substrate at a speed of up to 10 cm/sec. This is of great importance in the manufacture of integrated circuits with submicron details, in which contamination with such particles may have destructive consequences for the satisfactory operation of the circuit.

7 Claims, 1 Drawing Sheet

METHOD OF REMOVING UNDESIRED PARTICLES FROM A SURFACE OF A SUBSTRATE

BACKGROUND OF THE INVENTION

The invention relates to a method of removing undesired particles from a surface of a substrate, in which a removing force is exerted on the particles by means of a liquid.

Such a method is particularly suitable for removing undesired particles from a surface of a semiconductor substrate.

In the manufacture of integrated circuits (IC's), a substantial part of the rejected IC's is due to the unfavourable influence of particles which have adhered to the substrate in one of the processing steps. During the ultimate operation of the IC, these particles may give rise to instabilities, voltage breakdowns or shortcircuits, which render the whole IC unserviceable. During the manufacture of IC's, about 60% of the rejected IC's is due to such a contamination by small particles, so that removal of these particles is an important factor for the production yield.

U.S. Pat. No. 4,118,649 discloses a method of the kind mentioned in the opening paragraph, in which the force removing the particles is produced by megasonic waves. In this case, the substrate is located in a tank containing a cleaning liquid, in which megasonic waves are generated. The frequency of these waves is 0.2 to 5 MHz. Particles having a diameter of about 0.3 μm and larger can be effectively removed from the surface of the substrate.

The known method described has the disadvantage that the removal of the particles requires expensive and complicated equipment and that particles having a diameter smaller than about 0.3 μm cannot be effectively removed from the surface of the substrate.

Particles having a diameter of more than 10 to 20% of the minimum detail size in the IC can give rise to an ultimately unsatisfactory operation of the IC. This means that in the modern large-scale integration of components in IC's, in which details of the order of magnitude of 1 μm occur, particles having a diameter smaller than 0.3 μm can exert a destructive influence. Since the scale on which components are integrated in IC's is gradually on the increase, the unfavourable influence of particles having a diameter of 0.3 μm and smaller will in the future play an increasingly important part.

SUMMARY OF THE INVENTION

The invention has for its object to provide a method which permits removing in a simple manner undesired particles from a surface of a substrate, more particularly particles having a diameter smaller than 0.3 μm.

The invention is based on the following recognition. In the known method, the force by which the particles are removed from the surface of the substrate depends upon the cross-section of the particle to be removed and hence is proportional to the square of its radius. The force by which the particle adheres to the substrate on the contrary is directly proportional to the radius of the particle. This means that the cleaning effect of the known method strongly decreases with decreasing particle size. Thus, it is not possible by the known method to effectively remove particles having a diameter smaller than a given value from the surface of the substrate.

In accordance with the invention, the method mentioned in the opening paragraph is characterized in that the removing force is exerted by moving an interface of the liquid over the surface of the substrate. The term "an interface of a liquid" is to be understood to mean herein not only the surface of a liquid, but also a differently obtained phase boundary between the liquid and a gas as well as the phase boundary between the liquid and another liquid.

It has been found that the removing force which can be exerted by an interface of a liquid on a particle is a force which is caused by the surface tension of the interface and which, like the force by which the particle adheres to the substrate, is directly proportional to the radius of the particle. For the removal of particles from a surface of the substrate by means of the method according to the invention, the particle size consequently does not play a part, and particles having a diameter smaller than 0.3 μm can be effectively removed from the surface of the substrate. In addition, as will appear below, this can be realized in a simple manner.

Experiments have shown that the speed at which the interface is moved over the surface of the substrate plays an important part. Too high a speed does not lead to effective removal of particles adhered to the surface of the substrate. It is presumed that the interface requires some time to be adjusted. Moreover, the particle must be brought outside the force field by which it adheres to the substrate, which also requires some time. According to the invention, the method is carried out efficiently if the interface of the liquid is moved over the surface of the substrate at a speed of at most 10 cm/sec., above which the major part of the particles may not be removed.

During the step of wetting a surface (in this case the surface of the substrate or the surface of the particle) by a liquid, the interface of the liquid and this surface enclose an angle located in the liquid, which is designated hereinafter as the "wetting angle". This angle has a theoretical value in the range of from 0° to 180°, and as the angle is smaller, the wetting is said to be more satisfactory.

According to the invention, a preferred embodiment of the method is characterized in that the interface of the liquid is moved over the surface of the substrate, by immersing the substrate into the liquid. In this case, a particle adhered to the surface of the substrate is confronted with an advancing liquid. Thus, in a simple manner, particles which are wetted "less satisfactorily" (wetting angle greater than 30°) by the liquid can be removed from a substrate, provided that the substrate is wetted "satisfactorily" (wetting angle less than 90°) by the same liquid, which in practice is the case for a substantial part of all the particles.

Another preferred embodiment of the method according to the invention is characterized in that the interface of the liquid is moved over the surface of the substrate, by withdrawing the substrate from the liquid. In this case, a particle adhered to the surface of the substrate is confronted with a retracting liquid. Thus, in a simple manner, particles can be removed from a substrate, provided the substrate is "poorly" wetted by the liquid (wetting angle >90°), and the particles are wetted "less poorly" by the same liquid (wetting angle <150°), which in practice is also the case for a substantial part of all the particles of concern. This embodiment of the method has the additional advantage that, after having been effectively removed, the undesired particles are left in the liquid, and the substrate is situated outside the liquid so that a recontamination by the removed particles cannot occur.

A further preferred embodiment of the method according to the invention is characterized in that the interface of the liquid is its phase boundary with a gas bubble which is moved over the surface of the substrate, the substrate being immersed into the liquid. Thus, a particle adhered to the substrate is confronted successively both with an advancing liquid and with a retracting liquid and, irrespective of the extent of wetting of the substrate, most of the particles can be removed from the surface thereof. An additional advantage of this embodiment of the method according to the invention is that the efficiency can be simply increased by moving several gas bubbles at a time over the surface of the substrate.

Such a gas bubble in the form of a vapour bubble can be formed very readily by irradiation of the immersed substrate by a beam of laser radiation, and can be moved over the surface of the substrate by moving the beam of laser radiation over said surface. It has been found that the vapour bubble during its movement over the surface is not constantly equally large, but has a constantly varying diameter. Thus, an additional movement is superimposed on the movement of the interface caused by the movement of the laser beam.

A still more efficient method according to the invention is characterized in that the surface of the substrate and of the undesired particles adhered thereto are previously treated by a surface-active substance, as a result of which the surfaces of the substrate and of the particles will exhibit a less satisfactory wetting. Thus, particles and substrates whose wettability is otherwise too high for effective removal, may now be effectively removed by one of the preceding embodiments of the method according to the invention. Furthermore, by reducing the wettability of the substrate, recontamination with removed particles can thus be counteracted.

The treatment of the surfaces of the substrate and of the particles, as a result of which their wetting decreases, can be carried out efficiently if the surface-active substance is a substance chosen from the group of compounds consisting of silanes, alcohols and alkyl lithium.

BRIEF DESCRIPTION OF THE DRAWINGS

The invention will be described more fully hereinafter, by way of a few exemplary embodiments, with reference to a drawing. In the drawing.

The Figures are schematic and not drawn to scale, since for the sake of clarity the dimensions are greatly exaggerated.

DESCRIPTION OF THE PREFERRED EMBODIMENTS

Figure 1:
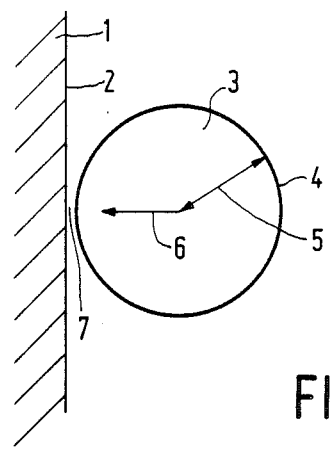
FIG. 1 shows diagrammatically a substrate having a surface on which a particle is present.

FIG. 1 shows diagrammatically a substrate 1 having a surface 2 to which a particle 3 has adhered. An attracting force $F_A$ indicated diagrammatically by an arrow 6 is exerted on the particle 3 by the substrate 1, for which it holds that:

$$F_A = \frac{AR}{6z^2},$$

in which R is the radius 5 of the particle 3, z is the distance 7 of the surface 4 of the particle 3 from the surface 2 of the substrate 1 and A is the so-called Hamaker constant. This force is directly proportional to the radius 5 of the particle 3. When removing such a particle 3 from the surface 2 of the substrate 1 by means of a liquid, this liquid must exert on the particle 3 a force which is larger than and is oppositely directed to the force $F_A$ 6 by which the particle 3 is adhered to the surface 2 of the substrate 1.

Removal of undesired particles from the surface of a substrate is of major importance in the manufacture of integrated circuits (IC's), in which particles having a diameter of more than 10 to 20% of the minimum detail size in the IC may lead to unsatisfactory operation of this IC. In the modern integration of components in IC's, details of the order of 1 μm occur. Particles having a diameter smaller than about 0.3 μm can therefore be very harmful.

In the known method, a liquid exerts a force on a particle by means of megasonic waves. This force is proportional to the cross-section of the particle and hence to the square of its radius. The value of this force consequently decreases with decreasing particle size much more rapidly than the attracting force FA, which is directly proportional to the radius R of the particle. With very small particles, this force can be smaller than $F_A$ so that these particles cannot be removed by means of the known method. It has been found that this is the case with particles having a diameter smaller than about 0.3 μm.

According to the invention, undesired particles 3 are removed from a surface 2 of a substrate 1 with a force exerted on the particles 3 by an interface of a liquid which is moved over the surface 2 of a substrate 1. The term "an interface of a liquid" is to be understood herein to mean not only the surface of a liquid, but also a differently realized phase boundary between the liquid and a gas and the phase boundary between the liquid and another liquid.

Figure 2:
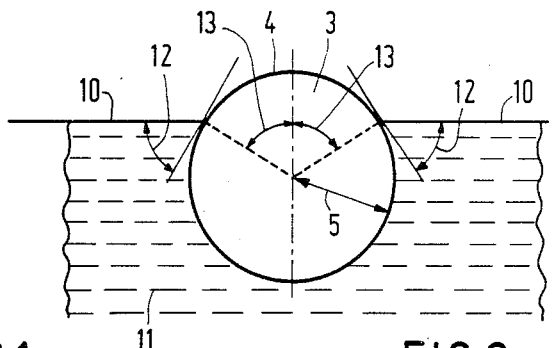
FIG. 2 shows diagrammatically a particle which has adhered to an interface of a liquid and is in a state of equlibrium.

FIG. 2 shows diagrammatically a particle 3 adhered to an interface 10 of a liquid 11. While a number of forces act upon particles, only the surface tension of the interface is of importance for the very small and light particles which are of concern here. Angle 12 located in the liquid which the interface 10 encloses with the surface 4 of the particle 3 and which is designated as wetting angle $\theta$ of the particle 3, while angle 13 represents the position of the interface 10 with respect to the particle 3, and is desigated as as angle $\omega$.

In the case shown in FIG. 2, the particle and liquid are in a state of equilibrium, and angle 12 ($\theta$) is equal to angle 13 ($\omega$) If the particle 3 is moved into the liquid 11, this movement is counteracted by the interface 10 of the liquid 11 with a force $F_1$ which has at most a value $F_{1,max} = 2\pi R y \sin^2(\theta/2)$, R being the radius 5 of the particle 3 and y being the surface tension of the interface 10. If the particle 3 is moved out of the liquid 11, this movement is counteracted by the interface 10 of the liquid 11 with the force $F_2$ which has a maximum value $F_{2,max} = -2\pi R y \sin^2(90° + \theta/2)$. Both the force $F_1$ and the force $F_2$ are directly proportional to the radius 5 of the particle 3.

According to the invention, the interface 10 of the liquid 11 is moved over the surface 2 of the substrate 1 at a speed of at most 10 cm/sec. If this speed is higher, the particles 3 are not effectively removed. Apparently, it requires some time before the interface 10 of the liquid 11 has been adjusted and before the particle 3 has been brought out of the attractive force field of the substrate 1.

Figure 3:
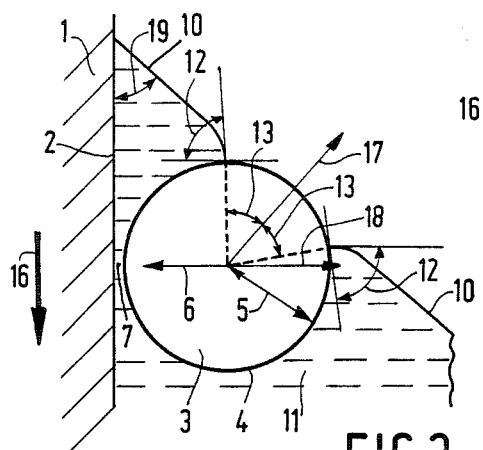
FIG. 3 shows diagrammatically a substrate having a surface on which a particle is present, the substrate having been moved into a liquid.

FIG. 3 shows diagrammatically a step of the method according to the invention, at a given constant, in which substrate 1, bearing particle 3, is moved, as indicated diagrammatically by an arrow 16, into the liquid 11. For the sake of clarity, only that part of the surface 10 of the liquid 11 is shown which is located in the immediate proximity of the surface 2 of the substrate 1. Thus, the particle 3 is confronted with an advancing liquid 11. The force $F_A$ 6 by which the particle 3 is adhered to the substrate 1 is counteracted by a component $F_1$ ($\rightarrow$) of the aforementioned force $F_1$ ($F_1$ indicated diagrammatically by an arrow 17) directed transversely to the surface 2 of the substrate. This component, $F_1$ ($\rightarrow$) is indicated diagrammatically by an arrow 18 and has a maximum value of:

$$F_{1,max}(\rightarrow) = 2\pi R y \sin^2(\theta/2) \cos \alpha,$$

where $\alpha$ is the angle 19 located in the liquid, which is enclosed by the surface 10 of the liquid 11 and the surface 2 of the substrate 1. This is the wetting angle of the substrate 1. This relationship for $F_1$, maximum shows that particle 3 can be removed from substrate 1 if it is satisfactorily wetted by the liquid 11 (i.e. $\alpha < 90°$), even though the particle is not wetted very well by the same liquid 11 (i.e. $\theta > 30°$), which in practice is the case for a substantial part of all particles of concern.

Figure 4:
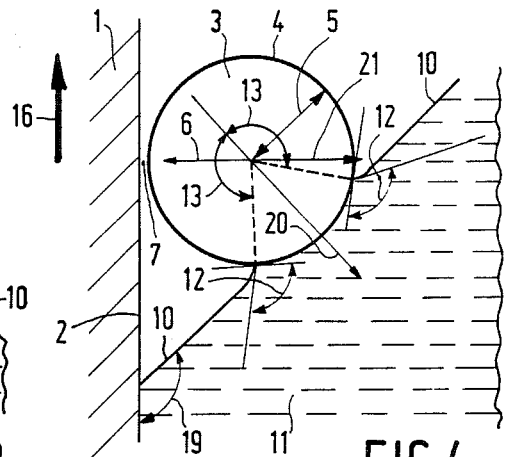
FIG. 4 shows diagrammatically a substrate having a surface on which a particle is present, the substrate having been moved out of a liquid.

FIG. 4 shows diagrammatically a step of the method according to the invention, at a given instant in which the substrarte 1, as indicated diagrammatically by the arrow 16, is moved out of the liquid 11. For the sake of clarity, only that part of the surface 10 of the liquid 11 is shown which is located in the immediate proximity of the surface 2 of the substrate 1. Thus, the particle 3 is confronted with a retracting liquid 11. The force $F_A$6 by which the particle 3 is adhered to the substrate 1 is counteracted here by a component $F_2$ ($\rightarrow$) of the aforementioned force $F_2$ (indicated diagrammatically by an arrow 20) which is directed transversely to the surface 2 of the substrate 1. This component, $F_2$ ($\rightarrow$) is indicated by an arrow 21 and has a maximum value of:

$$F_{2,max}(\rightarrow) = -2\pi R y \sin^2(90° + \theta/2) \cos \alpha$$

Thus, particles 3 can be removed from a substrate 1 which is wetted poorly by the liquid 11 ($\alpha > 90°$), if the particle is wetted less poorly by the same liquid 11 ($\theta < 150°$), which in practice is also the case for a substantial part of all particles. After having been removed, these particles are left in the liquid 11 so that recontamination is avoided.

Figure 5:
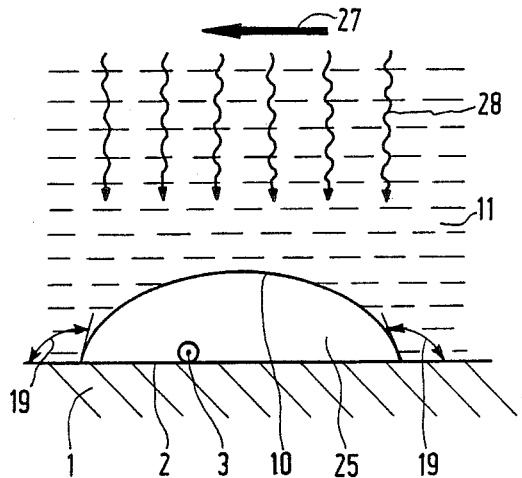
FIG. 5 shows diagrammatically a gas bubble which can be moved over a surface of a substrate on which a particle is present and which can be formed by means of laser radiation.

FIG. 5 shows a step of the method according to the invention, at a given instant in which interface 10 of the liquid 11 is the phase boundary with a gas bubble 25, which bubble 25, as indicated diagrammatically by an arrow 27, is moved over the surface 2 of the substrate 1, the substrate 1 being immersed into the liquid 11.

Thus, the particle 3 is confronted successively with an advancing and a retracting liquid 11. Irrespective of the wetting of the substrate 1 (in FIG. 5 a poor wetting, i.e. $\alpha > 90°$, is indicated) most of the particles 3 occurring in practice ($30° \leqq \theta \leqq 150°$) can be removed. The cleaning operation can be carried out more efficiently by moving simultaneously several gas bubbles over the surface 2 of the substrate 1.

Such a gas bubble 25 can be formed in a simple manner by irradiating the surface 2 of the substrate 1 with laser radiation indicated diagrammatically by arrows 28. In this case, the gas bubble 25 is a vapour bubble.

In the following examples, a silicon wafer having a diameter of about 10 cm was cleaned with ethanol and was then covered with a suspension of particles having a known size, which was then dried up. The wafer was then immersed in water. All values of $\theta$ and $\alpha$ given are thus relative to water as the wetting agent, unless otherwise indicated.

EXAMPLE 1

In the manner indicated, palladium particles ($\theta \approx 62°$) having a diameter of 0.1 to 0.3 $\mu$m were provided on a silicon wafer ($\alpha \approx 20°$) The wafer was slowly moved at a speed of about 1 mm/s into a water-containing beaker, after which it was quickly drawn out of the water. After one immersion, about 50% of the particles proved to be removed; after five immersions this percentage was about 80%. If such a wafer was moved into the water-containing beaker at a speed of more than 10 cm/s, an effective removal of the particles did not occur even after repeated immersions.

EXAMPLE 2

In this example, rutyl particles ($TiO_2$) ($\theta > 30°$) having a diameter of 0.1 to 1 $\mu$m were provided on a silicon wafer in the indicated manner. The wafer was moved slowly at a speed of about 3 $\mu$m/s into a water-containing beaker, after which it was quickly drawn out of the water. This embodiment resulted in an effective removal of about 85% of the particles. However, if such a wafer was moved at a speed of more than 10 cm/s into the water-containing beaker, substantially no particles were removed.

EXAMPLE 3

In the indicated manner, rod-shaped hematite particles ($\alpha Fe_2O_3$) having a diameter of about 0.1 $\mu$m and a length of about 0.8 $\mu$m were provided on the silicon slice ($\alpha \approx 20°$). The slice was moved slowly at a speed of about 3 $\mu$m/s into a water-containing beaker, after which it was quickly drawn out of the water. This resulted in an effective removal of about 97% of the particles. Also in this case, substantially no particles were removed if such a wafer was moved at a speed of more than 10 cm/s into the water-containing beaker.

In the following examples, the surface of the substrate and that of the undesired particles adhered thereto were previously treated by a surface-active substance, as a result of which the surfaces of the substrate and of the particles were wetted less satisfactorily. A suitable surface-active substance is one chosen from the group of compounds consisting of silanes, alcohols and alkyl lithium.

EXAMPLE 4

In the indicated manner, silicon oxide particles ($\theta \approx 0°$) having a diameter of about 0.7 µm were provided on the silicon wafer ($\alpha \approx 20°$). The wafer was then treated with a vapour of the silane compound $CF_3(CH_2)_2SiCl_3$ for 2 hours at a presure of 5 Pa and a temperature of about 100° C. By this pretreatment, a monomolecular layer of the said silane compound was deposited on the surface of the substrate and that of the particles, as a result of which the wetting with water of both surfaces was reduced to such an extend that for both surfaces the wetting angle assumed a value of about 76°. The wafer was then moved at a speed of 3 µm/s into a water-containing beaker, and the substrate was quickly drawn out of the water. About 75% of the particles proved to be removed. If the pretreatment was omitted, substantially no particle proved to be removed.

EXAMPLE 5

In the indicated manner, silicon oxide particles ($\theta \approx 0°$) having a diameter of 0.7 µm were provided on a silicon wafer ($\alpha \approx 20°$). Subsequently, the whole was treated for 2 hours at a temperature of 100° C. at a pressure of 5 Pa with a vapour of the silane compound $CF_3(CH_2)_7(CH_2)_2SiCl_3$, which resulted in deposition of a monomolecular layer of the said silane compound on the surface of the substrate and that of the particles, as a result of which the wetting with water of both surfaces was reduced to such an extent that after termination of this step their wetting angle had a value of about 100°. Subsequently, the whole was quickly immersed into a water-containing beaker, after which it was drawn out of the water slowly at a speed of about 3 µm/s. After termination of the cleaning operation, about 60% of the particles proved to be effectively removed. The removed particles were visible as a haze on the surface of the water in the beaker.

EXAMPLE 6

Another silicon wafer was treated in the same manner as in the preceding example. After the silane layer had been provided, the whole was immersed into a water-containing beaker, after which a beam of monochromatic laser radiation having a wavelength of 514 nm and a cross-section of about 20 µm was directed by means of an argon laser onto the surface of the substrate, as a result of which vapour bubbles were formed in situ and in the proximity of the beam on the surface of the substrate. The beam was moved in a lateral direction over the substrate at a speed of 16 µm/s. This resulted in the removal of about 95% of the particles. It has been found that during the movement over the surface of the substrate the vapour bubble was not constantly equally large, but had a constantly varying diameter. As a result, an additional movement was superimposed on the movement of the interface, which was produced by the movement of the laser beam, and this additional movement possibly accounts for the significant difference in efficiency from the preceding example.

It should be noted that, if in the aforementioned examples a glass substrate should be used instead of a silicon substrate, corresponding results would be obtained.

It would be appreciated that the invention is not limited to the examples given, but that many further variations are possible within the scope of the invention for those skilled in the art. For example, the wetting of the surfaces of the substrate and of the particles adhered thereto may be reduced by a treatment thereof with an alcohol or an alkyl lithium. The following table indicates a few examples of such treatment for a silicon substrate, for which the wetting angle $\alpha$ has a value 0° to 20°. The first column of the table lists the substances used to treat the silicon surface, and the second column lists the value of the wetting angle $\alpha$ of the silicon substrate resulting from the treatment.

| Surface-Active Substance | $\alpha$ After The Treatment |
| --- | --- |
| Alcohols: | |
| Heptanol | 81° |
| Decanol | 90° |
| Tetradecanol | 92° |
| Hexadecanol | 93° |
| Perfluoroctanol | 77° |
| Alkyllithium: | |
| Methyllithium | 44° |
| Butyllithium | 51° |

It is also possible to facilitate the removal of particles from a surface of a substrate by increasing the wetting of the surface and the particles adhered thereto with a surface-active substance. Thus, a substrate which is poorly wetted by a liquid ($\alpha > 90°$) may be treated so that particles may be removed from its surface by moving the substrate into the liquid. Further, particles which are wetted too poorly by a liquid ($\theta > 150°$) may be treated so that they may be removed from a surface of a substrate by moving the substrate out of the liquid.

What is claimed is:

1. A method of removing undesired particles up to 0.3 micrometers in size from a surface of a substrate, the method comprising moving an interface of the liquid over the surface of the substrate, characterized in that the interface of the liquid is moved over the surface of the substrate at a speed of at most 10 cm/sec.

2. A method as claimed in claim 1, characterized in that the interface of the liquid is moved over the surface of the substrate by immersing the substrate into the liquid.

3. A method as claimed in claim 1 characterized in that the interface of the liquid is moved over the surface of the substrate by withdrawing the substrate out of the liquid.

4. A method as claimed in claim 1 characterized in that the interface of the liquid is the phase boundary with a gas bubble which is moved over the surface of the substrate, the substrate being immersed into the liquid.

5. A method as claimed in claim 4, characterized in that the gas bubble is a vapour bubble which is formed by irradiating the substrate immersed into the liquid with a beam of laser radiation, and in that the bubble is moved over the surface of the substrate by moving the beam of laser radiation over said surface.

6. A method as claimed in claim 1, characterized in that the surfaces of the substrate and of the undesired particles adhered thereto are previously treated with a surface-active substance, as a result of which the wettability of the surface of the substrate and of the particles are reduced.

7. A method as claimed in claim 6, characterized in that the surface-active substance is a substance chosen from a group of compounds consisting of silanes, alcohols and alkyl lithium.

* * * * *